United States Patent
Hsu et al.

(10) Patent No.: US 8,634,254 B2
(45) Date of Patent: Jan. 21, 2014

(54) SINGLE-POLYCRYSTALLINE SILICON ELECTRICALLY ERASABLE AND PROGRAMMABLE MEMORY DEVICE OF VARIED GATE OXIDE THICKNESS, USING PIP OR MIM COUPLING CAPACITOR FOR CELL SIZE REDUCTION AND SIMULTANEOUS VPP AND VNN FOR WRITE VOLTAGE REDUCTION

(75) Inventors: Fu-Chang Hsu, San Jose, CA (US); Peter Wung Lee, Saratoga, CA (US)

(73) Assignee: APlus Flash Technology, Inc., Fremont, CA (US)

( * ) Notice: Subject to any disclaimer, the term of this patent is extended or adjusted under 35 U.S.C. 154(b) by 236 days.

(21) Appl. No.: 13/052,049

(22) Filed: Mar. 19, 2011

(65) Prior Publication Data
US 2011/0235437 A1 Sep. 29, 2011

Related U.S. Application Data

(60) Provisional application No. 61/341,086, filed on Mar. 25, 2010.

(51) Int. Cl.
G11C 16/04 (2006.01)

(52) U.S. Cl.
USPC .................. 365/185.29; 365/185.18

(58) Field of Classification Search
USPC .................. 365/185.29, 185.18, 184, 185.08, 365/189.11, 148, 185.25, 218, 189.01, 149, 365/203, 185.11
See application file for complete search history.

(56) References Cited

U.S. PATENT DOCUMENTS

| 6,100,560 A * | 8/2000 | Lovett ........................... 257/315 |
| 2008/0291728 A1* | 11/2008 | Terzioglu et al. ........ 365/185.08 |
| 2009/0201742 A1* | 8/2009 | Lee et al. ................. 365/185.24 |

* cited by examiner

Primary Examiner — Vu Le

(57) ABSTRACT

A single polycrystalline silicon floating gate nonvolatile memory device has a storage MOS transistor and at least one polycrystalline-insulator-polycrystalline (PIP) or metal-insulator-metal (MIM) capacitor manufactured with dimensions that can be fabricated using current low voltage logic integrated circuit process. The PIP or MIM capacitor is a coupling capacitor with a first plate connected to a floating gate of the storage MOS transistor to form a floating gate node. The coupling PIP or MIM capacitor couples the voltage level applied to a second plate of the PIP or MIM capacitor to the floating gate node with a large coupling ratio approximately 90% so as to initiate Fowler-Nordheim tunneling effect for erasing or programming the memory device. The memory device may also have another PIP or MIM capacitor with a first plate connected to the floating gate of the storage MOS transistor for serving as a tunneling capacitor.

41 Claims, 7 Drawing Sheets

| | | BL | WL | VCG | NW | SL | VEG |
|---|---|---|---|---|---|---|---|
| Program | Sel | VNN | VNN | VNN | 0V | VNN | VPP |
| | Inh | 0V | VNN | VNN | 0V | 0V | 0V |
| | UnSel | VNN | 0V | 0V | 0V | VNN | VPP |
| | | 0V | 0V | 0V | 0V | 0V | 0V |
| Erase | | VPP | 0V | VPP | VPP | VPP | VNN |
| Read | | 1V | 0V | 0V | VDD | VDD | 0V |
| Note | | (CA+Ccell)/CB > 10; CA > Ccell | | | | | |

| | | BL | WL | VCG | DNW | SL | VEG | TPW |
|---|---|---|---|---|---|---|---|---|
| Program | Sel | VPP | VPP | VPP | VPP | VPP | VNN | VPP |
| | Inh | VPP | VPP | VPP | VPP | VPP | 0V | VPP |
| | Unsel | VPP | 0V | 0V | VPP | VPP | VNN | VPP |
| | | VPP | 0V | 0V | VPP | VPP | 0V | VPP |
| Erase | | VNN | 0V | VNN | 0V | VNN | VPP | VNN |
| Read | | 1V | VDD | VDD | VDD | 0V | 0V | 0V |
| Note | | (CA+Ccell)/CB > 10; CA > Ccell | | | | | | |

| | | | BL | SL | WL | VCG | VEG |
|---|---|---|---|---|---|---|---|
| Option 1 | Program | Sel | VDD | VDD | VDD | VPP | VNN |
| | | Inh | VDD | VDD | VDD | VPP | 0V |
| | | Unsel | VDD | VDD | 0V | 0V | VNN |
| | | | VDD | VDD | 0V | 0V | 0V |
| | Erase | | 0V | 0V | VDD | VNN | VPP |
| Option 2 | Program | Sel | 0V | 0V | VDD | VNN | VPP |
| | | Inh | 0V | 0V | VDD | VNN | 0V |
| | | Unsel | 0V | 0V | 0V | 0V | VPP |
| | | | 0V | 0V | 0V | 0V | 0V |
| | Erase | | VDD | VDD | VDD | VPP | VNN |
| Read | | | 1V | 0V | VDD | VDD | 0V |
| Note | | | (CA+Ccell)/CB > 10; CA >> Ccell | | | | |

| | | | BL | SL | WL | VCG | VEG | NW |
|---|---|---|---|---|---|---|---|---|
| Option 1 | Program | Set | VDD | VDD | 0V | VPP | VNN | VDD |
| | | Inh | VDD | VDD | 0V | VPP | 0V | VDD |
| | | Unsel | VDD | VDD | VDD | 0V | VNN | VDD |
| | | | VDD | VDD | VDD | 0V | 0V | VDD |
| | Erase | | 0V | 0V | 0V | VNN | VPP | 0V |
| Option 2 | Program | Set | 0V | 0V | 0V | VNN | VPP | 0V |
| | | Inh | 0V | 0V | 0V | VNN | 0V | 0V |
| | | Unsel | 0V | 0V | VDD | 0V | VPP | 0V |
| | | | 0V | 0V | VDD | 0V | 0V | 0V |
| | Erase | | VDD | VDD | 0V | VPP | VNN | VDD |
| Read | | | 1V | VDD | 0V | 0V | 0V | VDD |
| Note | | | (CA+Ccell)/CB > 10; CA >> Ccell | | | | | |

| | | BL | WL | VCG | NW | SL |
|---|---|---|---|---|---|---|
| Program | Sel | VNN | VNN | VPP | 0V | VNN |
| | Inh | 0V | VNN | VPP | 0V | 0V |
| | Unsel | VNN | 0V | 0V | 0V | VNN |
| | | 0V | 0V | 0V | 0V | 0V |
| Erase | | VPP | 0V | VNN | VPP | VPP |
| Read | | 1V | 0V | 0V | VDD | VDD |
| Note | | CA/Ccell > 10 | | | | |

| | | BL | WL | VCG | DNW | SL | TPW |
|---|---|---|---|---|---|---|---|
| Program | Sel | VNN | 0V | VPP | 0V | VNN | VNN |
| | Inh | 0V | 0V | VPP | 0V | 0V | VNN |
| | Unsel | VNN | VNN | 0V | 0V | VNN | VNN |
| | | 0V | VNN | 0V | 0V | 0V | VNN |
| Erase | | VPP | VPP | VNN | VPP | VPP | VPP |
| Read | | 1V | VDD | VDD | VDD | 0V | 0V |
| Note | | CA/Ccell > 10 | | | | | |

|  | Category 1 | Category 2 | Category 3 |
|---|---|---|---|
| MOS Oxide Thickness | 400Å +/- 10% | 200Å +/- 10% | 100Å +/- 10% |
| VPP | 18V ~ 22V | 9V ~ 11V | 4.5V ~ 5.5V |
| VNN | -18V ~ -22V | -9V ~ -11V | -4.5V ~ -5.5V |

FIG. 7

SINGLE-POLYCRYSTALLINE SILICON ELECTRICALLY ERASABLE AND PROGRAMMABLE MEMORY DEVICE OF VARIED GATE OXIDE THICKNESS, USING PIP OR MIM COUPLING CAPACITOR FOR CELL SIZE REDUCTION AND SIMULTANEOUS VPP AND VNN FOR WRITE VOLTAGE REDUCTION

CROSS-REFERENCE TO RELATED APPLICATIONS

This application claims priority under 35 U.S.C. §119 to U.S. Provisional Patent Application Ser. No. 61/341,086, filed on Mar. 25, 2010, assigned to the same assignee as the present invention, and incorporated herein by reference in its entirety.

RELATED PATENT APPLICATIONS

U.S. Provisional patent application Ser. No. 12/378,036, filed on Feb. 10, 2009, assigned to the same assignee as the present invention, and incorporated herein by reference in its entirety.

BACKGROUND OF THE INVENTION

1. Field of the Invention

This invention relates generally to a single-polycrystalline logic-process-compatible integrated circuit memory. More particularly this invention relates to a single-polycrystalline silicon electrically erasable programmable floating gate memory device that comprises either PMOS or NMOS transistors.

2. Description of Related Art

In the semiconductor industry, generally, there are two important types of CMOS memories. One type is a volatile memory in which the stored data are not retained when its power supply is removed or shut down. The volatile memories include Static Random Access Memory (SRAM) and Dynamic Random Access Memory (DRAM). The other type is a non-volatile memory (NVM) in which the stored data can normally be retained for more than 20 years even after the power supply voltage source is completely disconnected.

Today, there are many different kinds of NVM memories aimed for different applications. For example, the most popular NVM today is NAND flash with a very small cell size of about $4\lambda^2$ ($\lambda^2$ being the smallest area in the design rule for a given semiconductor process) and is generally used to store huge blocks of data necessary for audio and video serial applications. The second popular NVM is NOR flash with one-transistor cell of about $10\lambda^2$ and is used to store program codes. The third type of NVM is 2-transistor floating gate tunneling oxide (FLOTOX) EEPROM with a cell size of about $80\lambda^2$. Unlike NAND and NOR Flash RAM that only allow big-block data alterability, EEPROM can achieve the largest number of program/erase (P/E) cycles. In the current design, the EEPROM is capable of 1M P/E cycles when it is operated in units of bytes for small data change applications.

There are several disadvantages for NVM. The on-chip high-voltage devices, charge-pump circuits, and complicated double-polycrystalline silicon cell structure are required for basic erase and program operations. Currently the above NVM cell devices are made of a complicated double-polycrystalline silicon high-voltage process. There are several disadvantages for the double-polycrystalline NVM cells. The required voltages for performing program and erase operations are too high for devices that are fabricated using a standard CMOS logic process. For example, the current 0.5 transistor per NAND cell structure requires +20V for Fowler-Nordheim tunneling program or erase operations. For a single transistor NOR flash cell, the channel-hot-electron program operation needs about +10V. However, the Fowler-Nordheim tunneling erase operation requires both +10V and −10V. A current two-transistor EEPROM memory cell structure requires +15V for both Fowler-Nordheim tunneling program erase. As a consequence, the program and erase operations for the above described three NVM cells require an on-chip charge-pump circuit that provides the high-voltage levels in the range from approximately 10V to approximately 20V. The peripheral devices of the NVM array thus require a high voltage breakdown for the operation. The high-voltage breakdown voltages are not compatible with the current process technology for the peripheral single-poly low-voltage logic devices. Having to implement the necessary process modifications to accomplish this high-voltage breakdown device result in increased manufacturing cost.

"A New Single-Poly Flash Memory Cell with Low-Voltage and Low-Power Operations for Embedded Applications", Chi, et al., The 5th Annual IEEE Device Research Conference Digest, June 1997, pp: 126-127, discusses a single-poly flash memory cell structure using triple-well CMOS technology and new program/erase schemes with operating voltage not exceeding the power voltage sources +/−Vcc. Conventional single-poly EPROM, although fully compatible with standard CMOS fabrication, has the disadvantages of high-voltage operations, slow programming, and not electrically erasable. The flash cell with the program/erase schemes permits low-voltage and low-power nonvolatile memory applications in CMOS mixed-signal circuits of system-on-a-chip.

U.S. Pat. No. 5,929,478 to Parris, et al. describes a single level gate nonvolatile memory device that includes a floating gate FET and a capacitor fabricated in two P-wells formed in an N-epitaxial layer on a P-substrate. P+ sinkers and N-type buried layers provide isolation between the two P-wells. The NVM device is programmed or erased by biasing the FET and the capacitor to move charge carriers onto or away from a conductive layer which serves as a floating gate of the FET. Data are read from the NVM device by sensing a current flowing in the FET while applying a reading voltage to the capacitor.

U.S. Pat. Nos. 6,992,927 and 7,164,606 to Poplevine, et al. provides a NVM array that includes four transistor PMOS non-volatile memory (NVM) cells having commonly connected floating gates. Each of the four transistors executes distinct control, erase, write and read operations, thereby allowing each device to be individually selected and optimized for performing its respective operation.

U.S. Provisional patent application Ser. No. 12/378,036, filed by the same applicant as the present invention, presented a single polycrystalline silicon floating gate nonvolatile memory cell that has a MOS capacitor and a storage MOS transistor fabricated with dimensions that can be fabricated using current low voltage logic integrated circuit process. The MOS capacitor has a first plate connected to a gate of the storage MOS transistor to form a floating gate node. Although the single polycrystalline silicon floating gate nonvolatile memory cell using a MOS capacitor can be fabricated using current low voltage logic integrated circuit process, the physical size of the MOS capacitor is relatively large in order to establish a large coupling ratio. As a result, the size of the memory cell is also large and makes it difficult to miniaturize the memory device or the integrated circuit using such single polycrystalline silicon floating gate nonvolatile memory cells.

SUMMARY OF THE INVENTION

The present invention has been made to provide a single-polycrystalline silicon electrically erasable programmable floating gate memory device that comprises either PMOS or NMOS transistors coupled with at least one PIP or MIM capacitor so as to replace the traditional MOS capacitors for reduce the size of the memory cell. The single-polycrystalline integrated circuit memory device of the invention is logic-process-compatible and comprises gate oxide with varied thickness in the range from below 100 Å to more than 400 Å to meet different design specifications and applications.

An object of this invention is to provide a single-polycrystalline thick floating gate transistor that is compatible with the high voltage and CMOS mixed signal process but uses at least one Polycrystalline-Insulator-Polycrystalline (PIP) capacitor. The single-polycrystalline high voltage (HV) device is made of either a PMOS or NMOS device with a gate oxide of around 400 Å thick to achieve superior data retention and low threshold voltage ($V_T$) disturbance during a read operation.

Another object of this invention is to provide a single-polycrystalline thick floating gate transistor that is compatible with the high voltage and CMOS mixed signal process but uses at least one Metal-Insulator-Metal (MIM) capacitor. The single-polycrystalline high voltage (HV) device is made of either a PMOS or NMOS device with a gate oxide of around 400 Å thick to achieve superior data retention and low threshold voltage (VT) disturbance during a read operation.

A further object of this invention is to provide a preferable bias voltage set which only requires +/−20V for both program and erase operations employing low-current Fowler Nordheim tunneling scheme for the single-polycrystalline thick floating gate transistor having a gate oxide of about 400 Å.

Still another object of this invention is to provide a single-polycrystalline thick floating gate transistor that provides high program and erase endurance cycles.

It is yet another object of this invention to provide a single-polycrystalline thick floating gate transistor with substantial cell size reduction by using at least one PIP capacitor rather than an NMOS or PMOS capacitor to avoid having a large well spacing in silicon layout.

It is yet further object of this invention to provide a single-polycrystalline thick floating gate transistor with substantial cell size reduction by using at least one MIM capacitor rather than an NMOS or PMOS capacitor to avoid having a large well spacing in silicon layout.

Still a further object of this invention is to provide a single-polycrystalline thick floating gate transistor with two preferable coupling PIP or MIM capacitors, one large and one small, in contrast to the traditional approach that only uses one large coupling capacitor. The size of the small capacitor is preferably made about the same as the single-polycrystalline thick floating gate transistor of this invention. The size of the large capacitor is preferably made more than 10 times of the total area of the small capacitor and the gate of the single-polycrystalline thick floating gate transistor.

Another object of this invention is to provide program and erase operations for the single-polycrystalline thick floating gate transistor with two coupling PIP or MIM capacitors. During the program and erase operations, the large and small capacitors are coupled with the preferable HV of opposite polarities denoted as VPP and VNN for reducing the required high-voltage. The voltages VPP and VNN applied to the two capacitors have to be reversed between program and erase operations. Accordingly, a HV NMOS or PMOS device with approximately 20V breakdown voltage (BVDS) can be used for proper program and erase operations of the single-polycrystalline thick floating gate transistor of the present invention.

A further object of this invention is to provide a single-polycrystalline floating gate transistor with gate oxide of thin or medium thickness. The thickness of the thin oxide is below 100 Å and the thickness of the medium oxide is in the range between 100 Å to 400 Å. The single-polycrystalline floating gate transistor with gate oxide of thin or medium thickness is preferably made compatible with the high voltage and CMOS mixed signal process but using a PIP capacitor. Both thin and medium oxide floating-gate single-polycrystalline devices are preferably made of either PMOS or NMOS device for cell size reduction purpose. It is understandable that the performance of data retention in memory cells with thin or medium gate oxide would not be as good as those with a thicker gate oxide of 400 Å.

In accordance with the present invention, there are three approaches to designing the single-polycrystalline silicon electrically erasable programmable floating gate memory device. The first approach is to have a single-polycrystalline silicon floating gate HV MOS transistor and two PIP or MIM capacitors fabricated with dimensions that can be manufactured using current high voltage and mixed signal integrated circuit process. Both two PIP or MIM capacitors have a first plate connected to the gate of the HV MOS transistor so that the gate of the HV MOS transistor is floating and forms a floating gate node of the floating gate HV MOS. The second plate of the PIP or MIM capacitor is formed by another layer of polycrystalline silicon.

One of the two PIP or MIM capacitors is made with the smallest size allowed in the design rule of the layout. It is used as the tunneling capacitor. The other PIP or MIM capacitor is made with a large physical size and used as a coupling capacitor. The drain of the HV MOS transistor is connected to the source side of a one pass HV MOS transistor and the source of the HV MOS transistor is connected to a source line. The physical size of the coupling PIP or MIM capacitor in combination with the HV MOS transistor is relatively large in comparison to the physical size of the tunneling PIP or MIM capacitor with a ratio of 10 or greater for the embodiments of this invention.

The large ratio between the physical sizes provides a large coupling ratio of approximately greater than 90%. When a voltage is applied to the second plate of the coupling PIP or MIM capacitor and drain (or source or bulk) of the HV MOS transistor, the large coupling ratio enables the coupling of a large fraction of the voltage applied to the second plate of the coupling PIP or MIM capacitor and drain (or source or bulk) of the HV MOS transistor to the floating gate node. A voltage applied to the tunneling PIP or MIM capacitor establishes a voltage field that initiates Fowler-Nordheim tunneling effect. When the voltage at the second plate of the coupling PIP or MIM capacitor and drain (or source or bulk) of the HV MOS transistor is negative and the voltage applied to the tunneling PIP or MIM capacitor is positive, charges present on the floating gate are extracted out of the floating gate. To the contrary, when the voltage at the second plate and drain (or source or bulk) of the HV MOS transistor is positive and the voltage applied to the tunneling PIP or MIM capacitor is negative, charges present underneath the insulator of the tunneling PIP or MIM capacitor are injected into the floating gate.

The second approach is to have a single-polycrystalline silicon floating gate medium voltage (MV) MOS transistor and two PIP or MIM capacitors fabricated with dimensions that can be manufactured using current high voltage and mixed signal integrated circuit process. In this embodiment, the MV MOS transistor is defined as a single-polycrystalline silicon floating gate MOS transistor having a thick gate oxide but with a lower voltage level denoted as VDD applied to the source/drain. Both two PIP or MIM capacitors have first plate connected to the gate of the MV MOS transistor so that the gate of the MV MOS transistor is floating and forms a floating gate node of the floating gate MV MOS. The second plate of the PIP or MIM capacitor is formed by another layer of polycrystalline silicon.

One of the two PIP or MIM capacitors is made with the smallest size allowed in the design rule of the layout. It is used as the tunneling capacitor. The other PIP or MIM capacitor is made with a large physical size and used a coupling capacitor. The drain of the MV MOS transistor is connected to the source side of a one pass MV MOS transistor and the source of the MV MOS transistor is connected to a source line. The physical size of the coupling PIP or MIM capacitor is relatively large in comparison to the physical size of the tunneling PIP or MIM capacitor with a ratio of 10 or greater for the embodiments of this invention.

The large ratio between the physical sizes provides a large coupling ratio of approximately greater than 90%. When a voltage is applied to the second plate of the coupling PIP or MIM capacitor, the large coupling ratio enables the coupling of a large fraction of the voltage applied to the second plate of the coupling PIP or MIM capacitor to the floating gate node. A voltage applied to the tunneling PIP or MIM capacitor establishes a voltage field that initiates Fowler-Nordheim tunnel effect. When the voltage at the second plate of the coupling PIP or MIM capacitor is negative and the voltage applied to the tunneling PIP or MIM capacitor is positive, charges present on the floating gate are extracted out of the floating gate. To the contrary, when the voltage at the second plate of the coupling PIP or MIM capacitor is positive and the voltage applied to the tunneling PIP or MIM capacitor is negative, charges present underneath the insulator of the tunneling PIP or MIM capacitor are injected into the floating gate.

The third approach is to have a single-polycrystalline silicon floating gate HV MOS transistor and a coupling PIP or MIM capacitor fabricated with dimensions that can be manufactured using current high voltage and mixed signal integrated circuit process. The coupling PIP or MIM capacitor has a first plate connected to the gate of the HV MOS transistor so that the gate of the HV MOS transistor is floating and forms a floating gate node of the floating gate HV MOS. The second plate of the PIP or MIM capacitor is formed by another layer of polycrystalline silicon. The drain of the HV MOS transistor is connected to the source side of a one pass HV MOS transistor and the source of the HV MOS transistor is connected to a source line.

The physical size of the coupling PIP or MIM capacitor is relatively large in comparison to the physical size of the HV MOS transistor with a ratio of 10 or greater for the embodiments of this invention. The large ratio between the physical sizes provides a large coupling ratio of approximately greater than 90%. When a voltage is applied to the second plate of the coupling PIP or MIM capacitor, the large coupling ratio enables the coupling of a large fraction of the voltage applied to the second plate of the coupling PIP or MIM capacitor to the floating gate node. A voltage applied to the drain (or source or bulk) of the HV MOS transistor establishes a voltage field within the gate oxide of the HV MOS transistor so that Fowler-Nordheim tunneling is initiated. When the voltage at the second plate of the coupling capacitor is negative and the voltage applied to the drain (or source) of the HV MOS transistor is positive, charges present on the floating gate are extracted out of the floating gate. To the contrary, when the voltage at the second plate of the coupling PIP or MIM capacitor is positive and the voltage applied to the drain (or source or bulk) of the HV MOS transistor is negative, charges present underneath the HV MOS gate oxide are injected into the floating gate.

BRIEF DESCRIPTION OF THE DRAWINGS

FIG. 7 is a table showing three major categories of technology to form a PIP or MIM capacitor.

DETAILED DESCRIPTION OF THE INVENTION

Figures 1A, 1B:
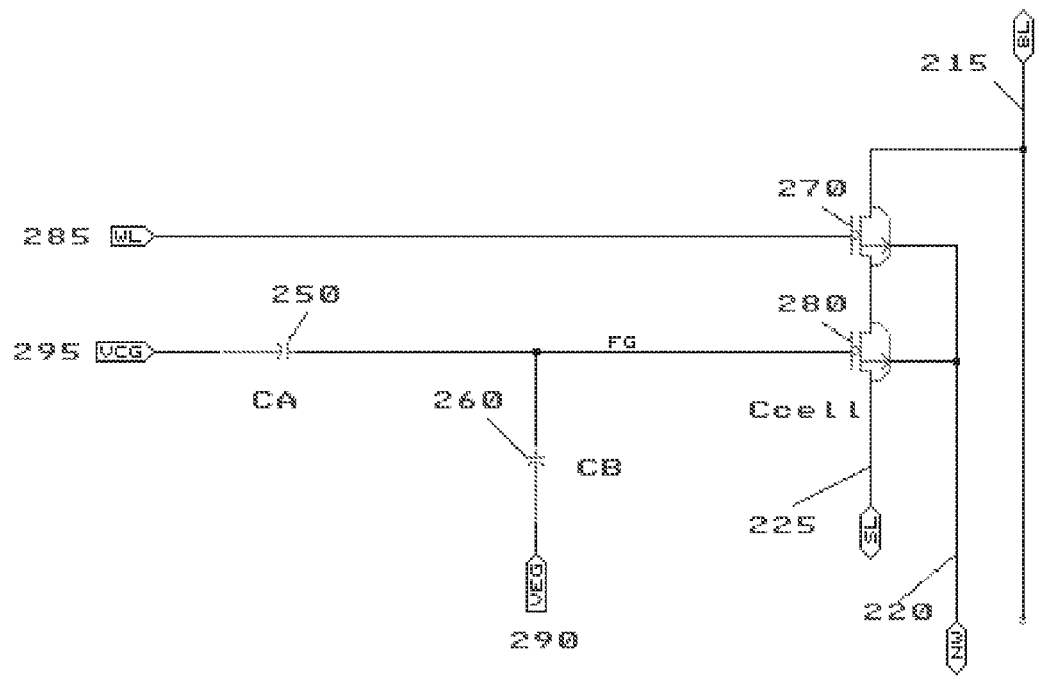
FIG. 1a is a schematic diagram of a floating gate HV PMOS transistor with two PIP or MIM capacitors according to the first embodiment of the present invention.
FIG. 1b is a table illustrating the voltage levels of voltage sources applied to the floating gate HV PMOS transistor with two PIP or MIM capacitors of the first embodiment.

FIG. 1a shows a schematic diagram of the first embodiment of the single-polycrystalline silicon electrically erasable programmable floating gate memory device of the present invention in which two HV transistors are single-poly PMOS transistors formed on an N-well (NW). The memory cell comprises a one pass HV PMOS transistor 270 and a floating gate HV PMOS storage transistor 280 with two PIP or MIM capacitors 250 and 260. The floating gate storage transistor HV PMOS 280 and the one pass transistor HV PMOS 270 are formed on NW 220. Those two HV PMOS transistors 270 and 280 are connected in series. The bit line BL 215 is connected to the drain side of HV PMOS 270 and the source line SL 225 is connected to the source side of HV PMOS 280.

According to the present invention, the single-polycrystalline floating gate HV PMOS storage transistor 280 of the first embodiment has a thick gate oxide with thickness approximately 400 Å, preferably in the range between 360 Å to 440 Å. The memory device requires only high voltages approximately +/−20V for both program and erase operations employing low-current Fowler Nordheim tunneling scheme. Preferably, the high voltage level is in the range between 18V to 22V.

With reference to the table in FIG. 1b, the program and erase operations for the storage HV PMOS transistor 280 refer to the Fowler-Nordheim tunneling program and erase operations occurring between the floating node FG at the first plate and the second plate of the tunneling PIP or MIM capacitor 260. During the program operation, VCG 295, WL 285, SL 225 and BL 215 are applied with a negative voltage VNN. NW 220 is connected with 0V. Because of the large coupling ratio, i.e., (CA+Ccell)/(CA+Ccell+CB)>90%, most of the negative voltage is coupled to the floating node FG, where Ccell is the effective capacitance of the HV PMOS transistor 280, and CA and CB are the capacitances of the two PIP or MIM capacitors 250 and 260 respectively. In the present invention, the value of CA is preferably greater than Ccell, and the ratio (CA+Ccell)/CB is preferably greater than 10.

As for the node VEG 290, it is applied with a positive voltage VPP and it only contributes less coupling voltage to FG because of the smaller capacitance CB of the PIP or MIM capacitor 260. With the bias voltages described above, a small electric field (~1 MV/cm) occurs at the coupling capacitor 250 and the HV PMOS transistor 280, and a strong electric field (>10 MV/cm) occurs at the tunneling PIP or MIM capacitor 260. As a result, electrons are extracted from the charge storage floating gate FG into the second plate of the tunneling PIP or MIM capacitor 260 through the tunneling oxide and the threshold voltage of the HV PMOS transistor 280 is increased. In the Fowler-Nordheim tunneling programming, it consumes only a current below 10 nA during the program operation of the present invention.

In a same manner, during the erase operation, VCG 295, SL 225 and BL 215 are applied with the positive voltage VPP. NW 220 is also connected to VPP. WL 285 is connected to 0V. Because of the large coupling ratio, i.e., (CA+Ccell)/(CA+Ccell+CB)>90%, most of the positive voltage is coupled to the floating node FG. As for the node VEG 290, it is applied with the negative voltage VNN and it only contributes less coupling voltage to FG because of the small capacitance CB of the PIP or MIM capacitor 260. With the bias voltages described above, a small electric field (~1 MV/cm) occurs at the coupling capacitor 250 and the HV PMOS transistor 280 and a strong electric field (>10 MV/cm) occurs at the tunneling PIP or MIM capacitor 260. As a result, electrons are injected from the second plate of the tunneling PIP or MIM capacitor 260 into the charge storage floating gate FG through the tunneling oxide and the threshold voltage of HV PMOS transistor 280 is decreased. In the Fowler-Nordheim tunneling erasing, it consumes only a current below 10 nA during the erase operation.

In the program inhibition for the storage HV PMOS transistor 280, VCG 295 and WL 285 are still applied with the negative voltage VNN but SL 225 and BL 215 are applied with 0V respectively. NW 220 is also connected with 0V. Therefore, only a certain portion, i.e., CA/(Ccell+CA+CB), of VNN will be coupled to the FG node. Because the node VEG 290 is applied with 0V accordingly, there is no coupling voltage to the FG node through the tunneling PIP or MIM capacitor 260. As a result, a smaller electric field (2~4 MV/cm) occurs at the tunneling capacitor 260 and the HV PMOS transistor 280 and a smallest electric field (~1 MV/cm) occurs at the coupling capacitor 250. With the biased conditions, the program inhibition prevents the threshold voltage of the HV PMOS transistor 280 from being changed.

For an unselected HV PMOS transistor 280 in a memory array during the program operation, there are two cases of program inhibition as shown in the table of FIG. 1b. In the first case, VCG 295 and WL 285 are applied with 0V but SL 225 and BL 215 are applied with the negative voltage VNN respectively. NW 220 is connected with 0V. Thus, HV PMOS transistor 280 stays at a shut-off state. In other words, only a certain portion, i.e. much smaller than Ccell/(Ccell+CA+CB), of VNN will be coupled to the FG node. Because the node VEG 290 is applied with VPP accordingly, there is less coupling voltage to the FG node through the tunneling PIP or MIM capacitor 260 and a smaller electric field (2~4 MV/cm) occurs at the tunneling PIP or MIM capacitor 260. As a result, the program inhibition can prevent the threshold voltage of the HV PMOS transistor 280 from being changed.

In the second case, VCG 295, WL 285, VEG 290, SL 225, NW 220 and BL 215 are all applied with 0V. Thus, there is no coupling voltage to the FG node through the tunneling PIP or MIM capacitor 260, the coupling PIP or MIM capacitor 250 or the HV PMOS transistor 280. Therefore, the program inhibition can prevent the threshold voltage of the HV PMOS transistor 280 from being changed.

In a read operation, the selected VCG 295, WL 285 and VEG 290 are applied with 0V respectively. SL 225 and NW 220 are applied with VDD. Thus, there is a read current flowing through the HV PMOS transistors 280 and 270 with 1V applied to BL 215 once the HV PMOS transistor 280 stays at the erase status.

Figures 2A, 2B:
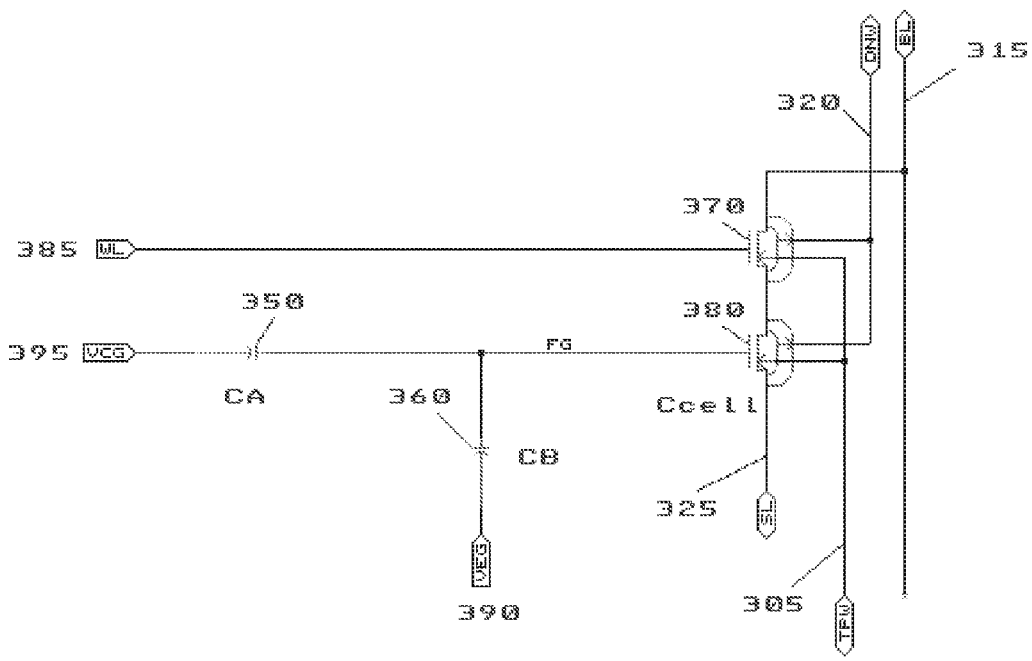
FIG. 2a is a schematic diagram of a floating gate HV NMOS transistor with two PIP or MIM capacitors according to the second embodiment of the present invention.
FIG. 2b is a table illustrating the voltage levels of voltage sources applied to the floating gate HV NMOS transistor with two PIP or MIM capacitors of the second embodiment.

FIG. 2a shows a schematic diagram of the second embodiment of the single-polycrystalline silicon electrically erasable programmable floating gate memory device of the present invention in which two high voltage (HV) transistors are single-poly NMOS transistors formed in a shallow p-type diffusion well, commonly referred to as a triple P-well (TPW), on a deep N-well (DNW). The memory cell comprises a one pass HV NMOS transistor 370 and a floating gate HV NMOS storage transistor 380 with two PIP or MIM capacitors 350 and 360. The floating gate HV NMOS 380 and one pass transistor HV NMOS 370 are formed on TPW 305 in DNW 320. Those two HV NMOS transistors 370 and 380 are connected in series. The bit line BL 315 is connected to the drain side of HV NMOS 370 and the source line SL 325 is connected to the source side of HV NMOS 380.

According to the present invention, the single-polycrystalline floating gate HV NMOS storage transistor 380 of the second embodiment has a thick gate oxide with thickness approximately 400 Å, preferably in the range between 360 Å to 440 Å. The memory device requires only high voltages approximately +/−20V for both program and erase operations employing low-current Fowler Nordheim tunneling scheme. Preferably, the high voltage level is in the range between 18V to 22V.

With reference to the table in FIG. 2b, the program and erase operations for the storage HV NMOS transistor 380 refer to the Fowler-Nordheim tunneling program and erase operations occurring between the floating node FG at the first plate and the second plate of the tunneling PIP or MIM capacitor 360. During the program operation, VCG 395, WL 385, SL 325, BL 315, TPW 305 and DNW 320 are applied with a positive voltage VPP. Because of the large coupling ratio, i.e., (CA+Ccell)/(CA+Ccell+CB)>90%, most of the positive voltage is coupled to the floating node FG, where Ccell is the effective capacitance of the HV NMOS transistor 380, and CA and CB are the capacitances of the two PIP or MIM capacitors 350 and 360 respectively. In the present invention, the value of CA is preferably greater than Ccell, and the ratio (CA+Ccell)/CB is preferably greater than 10.

As for the node VEG 390, it is applied with a negative voltage VNN and it only contributes less coupling voltage to FG because of the smaller capacitance CB of the PIP or MIM capacitor 360. With the bias voltages described above, a small electric field (~1 MV/cm) occurs at the coupling capacitor 350 and the HV NMOS transistor 380, and a strong electric field (>10 MV/cm) occurs at the tunneling PIP or MIM capacitor 360. As a result, electrons are injected from the second plate of the tunneling PIP or MIM capacitor 360 into the charge storage floating gate FG through the tunneling oxide and the threshold voltage of HV NMOS transistor 380 is increased. In the Fowler-Nordheim tunneling programming, it consumes only a current below 10 nA during the program operation of the present invention.

In a same manner, during the erase operation, VCG 395, SL 325, BL 315 and TPW 305 are applied with the negative voltage VNN. DNW is tied to 0V. WL 385 is also connected to 0V. Because of the large coupling ratio, i.e., (CA+Ccell)/(CA+Ccell+CB)>90%, most of the negative voltage is coupled to the floating node FG. As for the node VEG 390, it is applied with the positive voltage VPP and it only contributes less coupling voltage to FG because of the small capacitance CB of the PIP or MIM capacitor 360. With the bias voltages just described, a small electric field (~1 MV/cm) occurs at the coupling capacitor 350 and the HV NMOS transistor 380 and a strong electric field (>10 MV/cm) occurs at the tunneling PIP or MIM capacitor 360. As a result, electrons are extracted from the charge storage floating gate FG into the second plate of the tunneling PIP or MIM capacitor 360 through the tunneling oxide and the threshold voltage of HV NMOS transistor 380 is decreased. In the Fowler-Nordheim tunneling erasing, it consumes only a current below 10 nA during the erase operation.

In the program inhibition for the storage HV NMOS transistor 380, VCG 395, WL 385, DNW 320, TPW 305, SL 325 and BL 315 are still applied with the voltage VPP respectively. Therefore, only a certain portion, i.e., (CA+Ccell)/(Ccell+CA+CB), of VPP will be coupled to the FG node. Because the node VEG 390 is applied with 0V accordingly, there is no coupling voltage to the FG node through the tunneling PIP or MIM capacitor 360. As a result, a smaller electric field (4~5 MV/cm) occurs at the tunneling capacitor 360, and the smallest electric field (~1 MV/cm) occurs at the coupling capacitor 350 and the HV NMOS transistor 380. With the biased conditions, the program inhibition prevents the threshold voltage of the HV NMOS transistor 380 form being changed.

For an unselected HV NMOS transistor 380 in a memory array during the program operation, there are two cases of program inhibition as shown in the table of FIG. 2b. For the first case, DNW 320, TPW 305, SL 325 and BL 315 are still applied with the positive VPP respectively. VCG 395 and WL 385 are applied with 0V. Thus, only a certain portion, i.e., Ccell/(Ccell+CA+CB), of VPP will be coupled to the FG node. Because the node VEG 390 is applied with VNN accordingly, there is less coupling voltage to the FG node through the tunneling PIP or MIM capacitor 360 and a smaller electric field (4~5 MV/cm) occurs at the tunneling capacitor 360 and the HV NMOS transistor 380 and the smallest electric field (~1 MV/cm) occurs at the coupling PIP or MIM capacitor 350. As a result, the program inhibition can prevent the threshold voltage of the HV NMOS transistor 380 from being changed.

In the second case, DNW 320, TPW 305, SL 325 and BL 315 are still applied with VPP respectively. VCG 395 and WL 385 are applied with 0V. Thus, only a certain portion, i.e., Ccell/(Ccell+CA+CB), of VPP will be coupled to the FG node. Because the node VEG 390 is applied with 0V accordingly, there is no coupling voltage to the FG node through the tunneling PIP or MIM capacitor 360. Therefore, the smallest electric field (~1 MV/cm) occurs at the tunneling capacitor 360 and the coupling PIP or MIM capacitor 350 and the smaller electric field (~4-5 MV/cm) occurs at the HV NMOS transistor 380. As a result, the program inhibition can prevent the threshold voltage of the HV NMOS transistor 380 from being changed.

In a read operation, the selected VCG 395, WL 385 and DNW 320 are applied with VDD respectively. SL 325, VEG 390 and TPW 305 are applied with 0V. Thus, there is a read current flowing through the HV NMOS transistors 380 and 370 with 1V applied to BL 315 once the HV NMOS transistor 380 stays at the erase status.

Figures 3A, 3B:
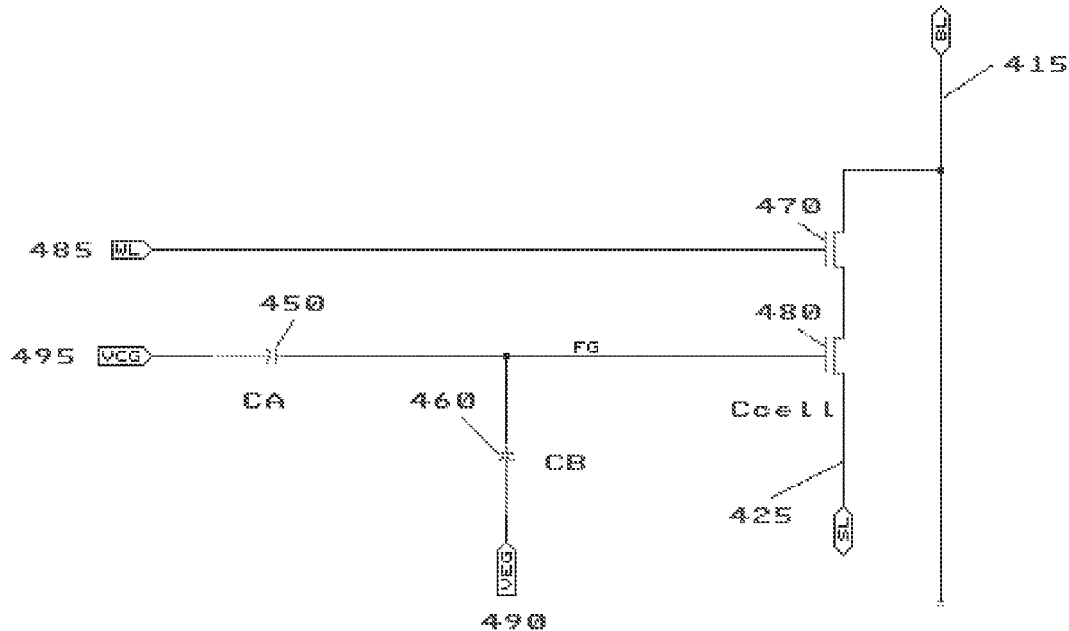
FIG. 3a is a schematic diagram of a floating gate MV NMOS transistor with two PIP or MIM capacitors according to the third embodiment of the present invention.
FIG. 3b is a table illustrating the voltage levels of voltage sources applied to the floating gate MV NMOS transistor with two PIP or MIM capacitors of the third embodiment.

FIG. 3a shows a schematic diagram of the third embodiment of the single-polycrystalline silicon electrically erasable programmable floating gate memory device of the present invention in which two MV (medium voltage) transistors are single-poly NMOS transistors formed on a P-substrate. The memory cell comprises a one pass MV NMOS transistor 470 and a floating gate MV NMOS transistor 480 with two PIP or MIM capacitors 450 and 460. The floating gate MV NMOS 480 and one pass transistor MV NMOS 470 are formed on the P-substrate. Those two MV NMOS transistors 470 and 480 are connected in series. BL 415 is connected to the drain side of MV NMOS 470 and SL 425 is connected to the source side of MV NMOS 480. In this embodiment, 0V and VDD voltage levels are used to bias the source/drain side of the MV NMOS transistor. However, the coupled high voltage will be established at the tunneling PIP or MIM capacitor 460 while performing erase and program operations.

According to the present invention, the single-polycrystalline floating gate MV NMOS storage transistor 480 of the third embodiment has a gate oxide with thickness from below 100 Å to 400 Å. In one configuration, the thickness of the gate oxide is approximately 200 Å, preferably in the range between 180 Å to 220 Å. In this configuration, the memory device requires only medium voltages approximately +/−10V for both program and erase operations employing low-current Fowler Nordheim tunneling scheme. Preferably, the medium voltage level is in the range between 9V to 11V. In another configuration, the thickness of the gate oxide is approximately 100 Å, preferably in the range between 90 Å to 110 Å. In this configuration, the memory device requires only medium voltages approximately +/−5V for both program and erase operations employing low-current Fowler Nordheim tunneling scheme. Preferably, the medium voltage level is in the range between 4.5V to 5.5V.

With reference to the table in FIG. 3b, the program and erase operations for the storage MV NMOS transistor 480 refer to the Fowler-Nordheim tunneling program and erase operations occurring between the floating node FG at the first plate and the second plate of the tunneling PIP or MIM capacitor 460. There are two options shown in the table. For the first option, during the program operation, VCG 495 is applied with a positive voltage VPP. However, WL 485, SL 425 and BL 415 are applied with VDD. Because of the large coupling ratio, i.e., (CA+Ccell)/(CA+Ccell+CB)>90%, most of the positive voltage is coupled to the floating node FG, where Ccell is the effective capacitance of the MV NMOS transistor 480, and CA and CB are the capacitances of the two PIP or MIM capacitors 450 and 460 respectively. In the present invention, the value of CA is preferably much greater than Ccell, and the ratio (CA+Ccell)/CB is preferably greater than 10.

As for the node VEG 490, it is applied with a negative voltage VNN and it only contributes less coupling voltage to FG because of the smaller capacitance CB of the PIP or MIM capacitor 460. With the bias voltages described above, a smallest electric field (~1 MV/cm) occurs at the coupling capacitor 450, a smaller electric field (4~5 MV/cm) occurs at the MV NMOS transistor 480 and a strong electric field (>10 MV/cm) occurs at the tunneling PIP or MIM capacitor 460. As a result, electrons are injected from the second plate of the tunneling PIP or MIM capacitor 460 into the charge storage floating gate FG through the tunneling oxide and the threshold voltage of the MV NMOS transistor 480 is increased. In the Fowler-Nordheim tunneling programming, it consumes only a current below 10 nA during program operation of the present invention.

In a same manner, during the erase operation, VCG 495 is applied with the negative voltage VNN. WL 485 is applied with VDD and both SL 425 and BL 415 are applied with 0V. Because of the large coupling ratio, i.e., (CA+Ccell)/(CA+Ccell+CB)>90%, most of the negative voltage is coupled to the floating node FG. As for the node VEG 490, it is applied with the positive voltage VPP and it only contributes less coupling voltage to FG because of the small capacitance CB of the PIP or MIM capacitor 460. With the bias voltages just described, a smallest electric field (~1 MV/cm) occurs at the coupling capacitor 450, a smaller electric field (4~5 MV/cm) occurs at the MV NMOS transistor 480 and a strong electric field (>10 MV/cm) occurs at the tunneling PIP or MIM capacitor 460. As a result, electrons are extracted from the charge storage floating gate FG into the second plate of the tunneling PIP or MIM capacitor 460 through the tunneling oxide and the threshold voltage of the MV NMOS transistor 480 is decreased. In the Fowler-Nordheim tunneling erasing, it consumes only a current below 10 nA during the erase operation.

In the program inhibition for the storage MV NMOS transistor 480, VCG 495 is still applied with the positive voltage VPP. However, WL 485, SL 425 and BL 415 are just applied with VDD. Therefore, only a certain portion, i.e., (Ccell/(Ccell+CA+CB) of VDD and (CA/(Ccell+CA+CB) of VPP, will be coupled to the FG node. Because the node VEG 490 is applied with 0V accordingly, there is no coupling voltage to the FG node through the tunneling PIP or MIM capacitor 460. As a result, the smallest electric field (~1 MV/cm) occurs at the coupling capacitor 450 and a smaller electric field (4~5 MV/cm) occurs at the MV NMOS transistor 480 and the tunneling PIP or MIM capacitor 460. With the biased conditions, the program inhibition prevents the threshold voltage of the MV NMOS transistor 480 form being changed.

For an unselected MV NMOS transistor 480 in a memory array during the program operation, there are two cases of program inhibition as shown in the table of FIG. 3b. For the first case, SL 425 and BL 415 are still applied with VDD respectively. VCG 495 and WL 485 are applied with 0V. Thus, only a certain portion, i.e., Ccell/(Ccell+CA+CB), of VDD will be coupled to the FG node. Because the node VEG 490 is applied with VNN accordingly, there is less coupling voltage to the FG node through the tunneling PIP or MIM capacitor 460, a smaller electric field (4~5 MV/cm) occurs at the tunneling capacitor 460 and the smallest electric field (~1 MV/cm) occurs at the coupling PIP or MIM capacitor 450 and the MV NMOS transistor 480. As a result, the program inhibition can prevent the threshold voltage of the MV NMOS transistor 480 from being changed.

In the second case, SL 425 and BL 415 are still applied with VDD respectively. VCG 495 and WL 485 are applied with 0V. Thus, only a certain portion, i.e., Ccell/(Ccell+CA+CB), of VDD will be coupled to the FG node. Because the node VEG 490 is applied with 0V accordingly, there is no coupling voltage to the FG node through the tunneling PIP or MIM capacitor 460. Therefore, the smallest electric field (~1 MV/cm) occurs at the tunneling capacitor 460, the coupling PIP or MIM capacitor 450 and the MV NMOS transistor 480. As a result, the program inhibition can prevent the threshold voltage of the MV NMOS transistor 480 from being changed.

For the second option in the table of FIG. 3b, during the program operation, VCG 495 is applied with a negative voltage VNN. However, WL 485 is applied with VDD and SL 425 and BL 415 are applied with 0V. Because of the large coupling ratio, i.e., CA/(CA+Ccell+CB)>90%, most of the negative voltage is coupled to the floating node FG. As for the node VEG 490, it is applied with a positive voltage VPP and it only contributes less coupling voltage to FG because of the smaller capacitance CB of the PIP or MIM capacitor 460. With the bias voltages described above, the smallest electric field (~1 MV/cm) occurs at the coupling capacitor 450, a smaller electric field (4~5 MV/cm) occurs at the MV NMOS transistor 480, and a strong electric field (>10 MV/cm) occurs at the tunneling PIP or MIM capacitor 460. As a result, electrons are extracted from the charge storage floating gate FG into the second plate of the tunneling PIP or MIM capacitor 460 through the tunneling oxide and the threshold voltage of MV NMOS transistor 480 is decreased. In the Fowler-Nordheim tunneling programming, it consumes only a current below 10 nA during the program operation.

In a same manner, during the erase operation, VCG 495 is applied with VPP. WL 485, SL 425 and BL 415 are applied with VDD. Because of the large coupling ratio, i.e., (CA+Ccell)/(CA+Ccell+CB)>90%, most of the positive voltage is coupled to the floating node FG. As for the node VEG 490, it is applied with VNN and it only contributes less coupling voltage to FG because of the small capacitance CB of the PIP or MIM capacitor 460. With the bias voltages just described, the smallest electric field (~1 MV/cm) occurs at the coupling capacitor 450, a smaller electric field (4~5 MV/cm) occurs at the MV NMOS transistor 480 and a strong electric field (>10 MV/cm) occurs at the tunneling PIP or MIM capacitor 460. As a result, electrons are injected from the second plate of the tunneling PIP or MIM capacitor 460 into the charge storage floating gate FG through the tunneling oxide and the threshold voltage of MV NMOS transistor 480 is increased. In the Fowler-Nordheim tunneling erasing, it consumes only a current below 10 nA during program operation.

In the programming inhibition for the storage MV NMOS transistor 480, VCG 495 is still applied with VNN. However, WL 485 is applied with VDD and both SL 425 and BL 415 are just applied with 0V. Therefore, only a certain portion, i.e., (CA/(Ccell+CA+CB), of VNN will be coupled to the FG node. Because the node VEG 490 is applied with 0V accordingly, there is no coupling voltage to the FG node through the tunneling PIP or MIM capacitor 460. As a result, the smallest electric field (~1 MV/cm) occurs at the coupling capacitor 450 and a smaller electric field (4~5 MV/cm) occurs at the MV NMOS transistor 480 and the tunneling PIP or MIM capacitor 460. With the biased conditions, the program inhibition prevents the threshold voltage of the MV NMOS transistor 480 from being changed.

For an unselected MV NMOS transistor 480 in a memory during the program operation, there are two cases of program inhibition as shown in the table of FIG. 3b. For the first case, SL 425 and BL 415 are still applied with 0V respectively. VCG 495 and WL 485 are also applied with 0V. Thus, there is no voltage coupled to the FG node. Because the node VEG 490 is applied with VPP accordingly, there is less coupling voltage to the FG node through the tunneling PIP or MIM capacitor 460, a smaller electric field (4~5 MV/cm) occurs at the tunneling capacitor 460 and the smallest electric field (~1 MV/cm) occurs at the coupling PIP or MIM capacitor 450 and the MV NMOS transistor 480. As a result, the program inhibition can prevent the threshold voltage of the MV NMOS transistor 480 from being changed.

In the second case, SL 425 and BL 415, VCG 495, WL 485 and VEG 490 are applied with 0V respectively. Therefore, no electric field occurs at the tunneling capacitor 460, the coupling PIP or MIM capacitor 450 and the MV NMOS transistor 480. As a result, the program inhibition can prevent the threshold voltage of the MV NMOS transistor 480 from being changed.

In a read operation, the selected VCG 495 and WL 485 are applied with VDD respectively. SL 425 and VEG 490 are applied with 0V. Thus, there is a read current flowing through the MV NMOS transistors 480 and 470 with 1V applied to BL 415 once MV NMOS transistor 480 stays at the erase status in the first option and stays at the program status in the second option.

Figures 4A, 4B:
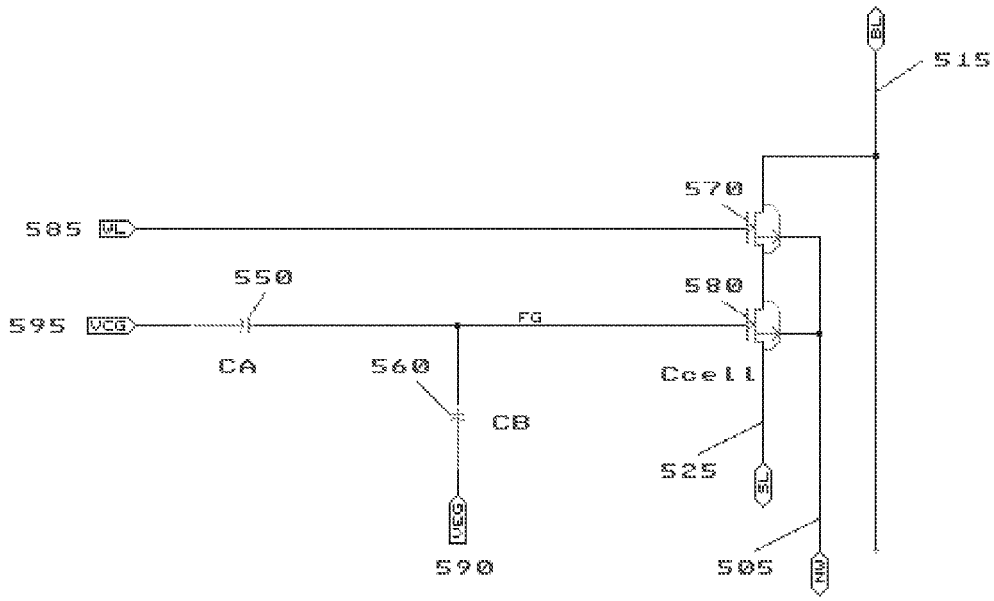
FIG. 4a is a schematic diagram of a floating gate MV PMOS transistor with two PIP or MIM capacitors according to the fourth embodiment of the present invention.
FIG. 4b is a table illustrating the voltage levels of voltage sources applied to the floating gate MV PMOS transistor with two PIP or MIM capacitors of the fourth embodiment.

FIG. 4a shows a schematic diagram of the fourth embodiment of the single-polycrystalline silicon electrically erasable programmable floating gate memory device of the present invention in which two MV transistors are single-poly PMOS transistors formed in an N-well (NW). The memory cell comprises a one pass MV PMOS transistor 570 and a floating gate MV PMOS storage transistor 580 with two PIP or MIM capacitors 550 and 560. The floating gate MV PMOS 580 and one pass transistor MV PMOS 570 are formed on NW 505. Those two MV PMOS transistors 570 and 580 are connected in series. BL 515 is connected to the drain side of MV PMOS 570 and SL 525 is connected to the source side of MV PMOS 580. In this embodiment, 0V and VDD voltage levels are used to bias the source/drain side of the MV PMOS transistor. However, the coupled high voltage will be established at the tunneling PIP or MIM capacitor 560 while performing erase and program operations.

According to the present invention, the single-polycrystalline floating gate MV PMOS storage transistor 580 of the fourth embodiment has a gate oxide with thickness from below 100 Å to 400 Å. In one configuration, the thickness of the gate oxide is approximately 200 Å, preferably in the range between 180 Å to 220 Å. In this configuration, the memory device requires only medium voltages approximately +/−10V for both program and erase operations employing low-current Fowler Nordheim tunneling scheme. Preferably, the medium voltage level is in the range between 9V to 11V. In another configuration, the thickness of the gate oxide is approximately 100 Å, preferably in the range between 90 Å to 110 Å. In this configuration, the memory device requires only medium voltages approximately +/−5V for both program and erase operations employing low-current Fowler Nordheim tunneling scheme. Preferably, the medium voltage level is in the range between 4.5V to 5.5V.

With reference to the table in FIG. 4b, the program and erase operations for the storage MV PMOS transistor 580 refer to the Fowler-Nordheim tunneling program and erase operations occurring between the floating node FG at the first plate and the second plate of the tunneling PIP or MIM capacitor 560. There are two options shown in the table. For the first option, during the program operation, VCG 595 is applied with a positive voltage VPP. However, WL 585 is applied with 0V and both SL 525 and BL 515 are just applied with VDD. NW 505 is also connected to VDD. Because of the large coupling ratio, i.e., (CA+Ccell)/(CA+Ccell+CB)>90%, most of the positive voltage is coupled to the floating node FG, where Ccell is the effective capacitance of the MV PMOS transistor 580, and CA and CB are the capacitances of the two PIP or MIM capacitors 550 and 560 respectively. In the present invention, the value of CA is preferably much greater than Ccell, and the ratio (CA+Ccell)/CB is preferably greater than 10.

As for the node VEG 590, it is applied with a negative voltage VNN and it only contributes less coupling voltage to FG because of the smaller capacitance CB of the PIP or MIM capacitor 560. With the bias voltages described above, the smallest electric field (~1 MV/cm) occurs at the coupling capacitor 550, a smaller electric field (4~5 MV/cm) occurs at the MV PMOS transistor 580 and a strong electric field (>10 MV/cm) occurs at the tunneling PIP or MIM capacitor 560. As a result, electrons are injected from the second plate of the tunneling PIP or MIM capacitor 560 into the charge storage floating gate FG through the tunneling oxide and the threshold voltage of the MV PMOS transistor 580 is decreased. In the Fowler-Nordheim tunneling programming, it consumes only a current below 10 nA during program operation of the present invention.

In a same manner, during the erase operation, VCG 595 is applied with the negative voltage VNN. WL 585, SL 525 and BL 515 are applied with 0V. NW 505 is also connected to 0V. Because of the large coupling ratio, i.e., (CA+Ccell)/(CA+Ccell+CB)>90%, most of the negative voltage is coupled to the floating node FG. As for the node VEG 590, it is applied with the positive voltage VPP and it only contributes less coupling voltage to FG because of the small capacitance CB of the PIP or MIM capacitor 560. With the bias voltages just described, the smallest electric field (~1 MV/cm) occurs at the coupling capacitor 550, a smaller electric field (4~5 MV/cm) occurs at the MV PMOS transistor 580 and a strong electric field (>10 MV/cm) occurs at the tunneling PIP or MIM capacitor 560. As a result, electrons are extracted from the charge storage floating gate FG into the second plate of the tunneling PIP or MIM capacitor 560 through the tunneling oxide and the threshold voltage of the MV PMOS transistor 580 is increased. In the Fowler-Nordheim tunneling erasing, it consumes only a current below 10 nA during erase operation.

In the program inhibition for the storage MV PMOS transistor 580, VCG 595 is still applied with the positive voltage VPP. However, WL 585 is applied with 0V and both SL 525 and BL 515 are just applied with VDD. NW 505 is also connected to VDD. Therefore, only a certain portion, i.e., (Ccell/(Ccell+CA+CB) of VDD and (CA/(Ccell+CA+CB) of VPP, will be coupled to the FG node. Because the node VEG 590 is applied with 0V accordingly, there is no coupling voltage to the FG node through the tunneling PIP or MIM capacitor 560. As a result, the smallest electric field (~1 MV/cm) occurs at the coupling capacitor 550 and a smaller electric field (4~5 MV/cm) occurs at the MV PMOS transistor 580 and the tunneling PIP or MIM capacitor 560. With the biased conditions, the program inhibition prevents the threshold voltage of the MV PMOS transistor 580 form being changed.

For an unselected MV PMOS transistor 580 in a memory array during the program operation, there are two cases of program inhibition as shown in the table of FIG. 4b. For the first case, SL 525 and BL 515 are still applied with VDD respectively. VCG 595 is applied with 0V and WL 585 is applied with VDD. NW 505 is also connected to VDD. Thus, only a certain portion, i.e., Ccell/(Ccell+CA+CB) of VDD will be coupled to the FG node. Because the node VEG 590 is applied with VNN accordingly, there is less coupling voltage to the FG node through tunneling PIP or MIM capacitor 560, a smaller electric field (4~5 MV/cm) occurs at the tunneling capacitor 560 and the smallest electric field (~1 MV/cm) occurs at the coupling PIP or MIM capacitor 550 and the MV PMOS transistor 580. As a result, the program inhibition can prevent the threshold voltage of the MV PMOS transistor 580 from being changed.

In the second case, SL 525 and BL 515 are still applied with VDD respectively. VCG 595 is applied with 0V and WL 585 is applied with VDD. NW 505 is also connected to VDD. Thus, a certain portion, i.e., Ccell/(Ccell+CA+CB), of VDD will be coupled to the FG node. Because the node VEG 590 is applied with 0V accordingly, there is no coupling voltage to the FG node through the tunneling PIP or MIM capacitor 560. Therefore, the smallest electric field (~1 MV/cm) occurs at the tunneling capacitor 560, the coupling PIP or MIM capacitor 550 and the MV PMOS transistor 580. As a result, the program inhibition can prevent the threshold voltage of the MV PMOS transistor 580 from being changed.

For the second option in the table of FIG. 4b, during the program operation, VCG 595 is applied with a negative voltage VNN. However, WL 585, SL 525 and BL 515 are applied with 0V. NW 505 is also connected to 0V. Because of the large coupling ratio, i.e., CA/(CA+Ccell+CB)>90%, most of the negative voltage is coupled to the floating node FG. As for the node VEG 590, it is applied with VPP and it only contributes less coupling voltage to FG because of the smaller capacitance CB of the PIP or MIM capacitor 560. With the bias voltages described above, the smallest electric field (~1 MV/cm) occurs at the coupling capacitor 550, a smaller electric field (4~5 MV/cm) occurs at the MV PMOS transistor 580 and a strong electric field (>10 MV/cm) occurs at the tunneling PIP or MIM capacitor 560. As a result, electrons are extracted from the charge storage floating gate FG into the second plate of the tunneling PIP or MIM capacitor 560 through the tunneling oxide and the threshold voltage of MV PMOS transistor 580 is increased. In the Fowler-Nordheim tunneling programming, it consumes only a current below 10 nA during the program operation.

In a same manner, during the erase operation, VCG 595 is applied with VPP. WL 585 is applied with 0V and both SL 525 and BL 515 are applied with VDD. NW 505 is also connected to VDD. Because of the large coupling ratio, i.e., (CA+Ccell)/(CA+Ccell+CB)>90%, most of the positive voltage is coupled to the floating node FG. As for the node VEG 590, it is applied with VNN and it only contributes less coupling voltage to FG because of the small capacitance CB on the PIP or MIM capacitor 560. With the bias voltages just described, the smallest electric field (~1 MV/cm) occurs at the coupling capacitor 550, a smaller electric field (4~5 MV/cm) occurs at the MV PMOS transistor 580 and a strong electric field (>10 MV/cm) occurs at the tunneling PIP or MIM capacitor 560. As a result, electrons are injected from the second plate of the tunneling PIP or MIM capacitor 560 into the charge storage floating gate FG through the tunneling oxide and the threshold voltage of the MV PMOS transistor 580 is decreased. In the Fowler-Nordheim tunneling programming, it consumes only a current below 10 nA during program operation.

In the programming inhibit for the storage MV PMOS transistor 580, VCG 595 is still applied with VNN. However, WL 585, SL 525 and BL 515 are just applied with 0V. NW 505 is also connected to 0V. Therefore, only a certain portion, i.e., (CA/(Ccell+CA+CB), of VNN will be coupled to the FG node. Because the node VEG 590 is applied with 0V accordingly, there is no coupling voltage to the FG node through the tunneling PIP or MIM capacitor 560. As a result, the smallest electric field (~1 MV/cm) occurs at the coupling capacitor 550 and a smaller electric field (4~5 MV/cm) occurs at the MV PMOS transistor 580 and the tunneling PIP or MIM capacitor 560. With the biased conditions, the program inhibition prevents the threshold voltage of the MV PMOS transistor 580 from being changed.

For an unselected MV PMOS transistor 580 in a memory array during the program operation, there are two cases of program inhibition shown in the table of FIG. 4b. For the first case, VCG 595, SL 525 and BL 515 are still applied with 0V respectively. WL 585 is applied with VDD. NW 505 is still connected to 0V. Thus, there is no voltage coupled to the FG node. Because the node VEG 590 is applied with VPP accordingly, there is less coupling voltage to the FG node through the tunneling PIP or MIM capacitor 560, a smaller electric field (4~5 MV/cm) occurs at the tunneling capacitor 560 and the smallest electric field (~1 MV/cm) occurs at the coupling PIP or MIM capacitor 550 and the MV PMOS transistor 580. As a result, the program inhibition can prevent the threshold voltage of the MV PMOS transistor 580 from being changed.

In the second case, SL 525 and BL 515, VCG 595, and VEG 590 are applied with 0V respectively. WL 585 is applied with VDD. NW 505 is still connected to 0V. Therefore, no electric field occurs at the tunneling capacitor 560, the coupling PIP or MIM capacitor 550 and the MV PMOS transistor 580. As a result, the program inhibition can prevent the threshold voltage of the MV PMOS transistor 580 from being changed.

In a read operation, the selected VCG 595 and WL 585 are applied with 0V respectively. SL 525 and NW 505 are applied with VDD and VEG 590 is applied with 0V. Thus, there is a read current flowing through the MV PMOS transistors 580 and 570 with 1V applied to BL 515 once the MV PMOS transistor 580 stays at the program status in the first option and stays at the erase status in second option.

Figures 5A, 5B:
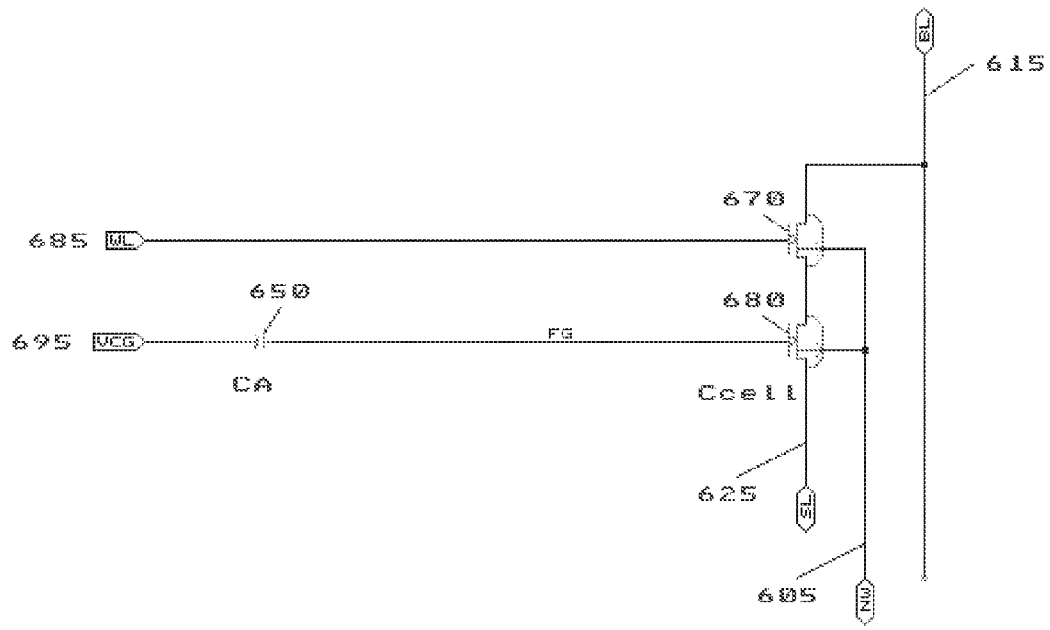
FIG. 5a is a schematic diagram of a floating gate HV PMOS transistor with one PIP or MIM capacitor according to the fifth embodiment of the present invention.
FIG. 5b is a table illustrating the voltage levels of voltage sources applied to the floating gate HV PMOS transistor with one PIP or MIM capacitor of the fifth embodiment.

FIG. 5a shows a schematic diagram of the fifth embodiment of the single-polycrystalline silicon electrically erasable programmable floating gate memory device of the present invention in which two HV transistors are single-poly PMOS transistors formed in an N-well (NW). The memory cell comprises a one pass HV PMOS transistor 670 and a floating gate HV PMOS storage transistor 680 with one PIP or MIM capacitor 650. The floating gate HV PMOS 680 and one pass transistor HV PMOS 670 are formed on NW 605. Those two HV PMOS transistors 670 and 680 are connected in series. BL 615 is connected to the drain side of HV PMOS 670 and SL 625 is connected to the source side of HV PMOS 680. In this embodiment, VNN and VPP voltage levels are used to bias the source/drain side of the HV PMOS transistor. However, the coupled high voltage will be established at the HV PMOS transistor 670 while performing erase and program operations.

According to the present invention, the single-polycrystalline floating gate HV PMOS storage transistor 680 of the fifth embodiment has a thick gate oxide with thickness approximately 400 Å, preferably in the range between 360 Å to 440 Å. The memory device requires only high voltages approximately +/−20V for both program and erase operations employing low-current Fowler Nordheim tunneling scheme. Preferably, the high voltage level is in the range between 18V to 22V.

With reference to the table in FIG. 5b, the program and erase operations for the storage HV PMOS transistor 680 refer to the Fowler-Nordheim tunneling program and erase operations occurring at the insulator oxide of HV PMOS transistor 680. During the program operation, VCG 695 is applied with VPP. However, WL 685, SL 625 and BL 615 are applied with VNN. NW 605 is connected to 0V. Because of the large coupling ratio, i.e., CA/(CA+Ccell)>90%, most of the positive voltage is coupled to the floating node FG, where Ccell is the effective capacitance of the HV PMOS transistor 680 and CA is the capacitance of the PIP or MIM capacitor 650. In the present invention, the ratio CA/Ccell is preferably greater than 10. Therefore, the smallest electric field (~1 MV/cm) occurs at the coupling capacitor 650 and a strong electric field (>10 MV/cm) occurs at the HV PMOS transistor 680. As a result, electrons are injected from the source/drain side of the HV PMOS transistor 680 into the charge storage floating gate FG through the insulator oxide and the threshold voltage of the HV PMOS transistor 680 is decreased. In the Fowler-Nordheim tunneling programming, it consumes only a current below 10 nA during program operation.

In a same manner, during the erase operation, VCG 695 is applied with VNN. WL 685 is applied with 0V and SL 625, BL 615 and NW 605 are applied with VPP. Because of the large coupling ratio, i.e., CN (CA+Ccell)>90%, most of the negative voltage is coupled to the floating node FG. Therefore, the smallest electric field (~1 MV/cm) occurs at the coupling capacitor 650 and a strong electric field (>10 MV/cm) occurs at the HV PMOS transistor 680. As a result, electrons are extracted from the charge storage floating gate FG into the channel underneath the insulator oxide of the HV PMOS transistor 680 and the threshold voltage of the HV PMOS transistor 680 is increased. In the Fowler-Nordheim tunneling erasing, it consumes only a current below 10 nA during erase operation.

In the programming inhibition for the storage HV PMOS transistor 680, VCG 695 is still applied with VPP. However, WL 685 is applied with VNN and both SL 625 and BL 615 are just applied with 0V. NW 605 is also connected to 0V. Thus, a certain portion, i.e., CA/(Ccell+CA), of VPP will be coupled to the FG node. As a result, the smallest electric field (~1 MV/cm) occurs at the coupling capacitor 650 and a smaller electric field (4~5 MV/cm) occurs at the HV PMOS transistor 680. With the biased conditions, the program inhibition prevents the threshold voltage of the HV PMOS transistor 680 from being changed.

For an unselected HV PMOS transistor 680 in a memory array during the program operation, there are two cases of program inhibition shown in the table of FIG. 5b. For the first case, SL 625 and BL 615 are still applied with VNN respectively. VCG 695 and WL 685 are applied with 0V. NW 605 is also connected to 0V. Thus, only a certain portion, i.e., Ccell/(Ccell+CA), of VNN will be coupled to the FG node. The smallest electric field (~1 MV/cm) occurs at the coupling capacitor 650 and the HV PMOS transistor 680. As a result, the program inhibition can prevent the threshold voltage of the HV PMOS transistor 680 from being changed.

In the second case, SL 625 and BL 615, WL 685, VCG 695 and NW 605 are applied with 0V respectively. Therefore, no electric field occurs at the coupling PIP or MIM capacitor 650 and the HV PMOS transistor 680. As a result, the program inhibition can prevent the threshold voltage of the HV PMOS transistor 680 from being changed.

In a read operation, the selected VCG 695 and WL 685 are applied with 0V respectively. SL 625 and NW 605 are applied with VDD. Thus, there is a read current flowing through the HV PMOS transistors 680 and 670 with 1V applied to BL 615 once the HV PMOS transistor 680 stays at the program status.

Figures 6A, 6B:
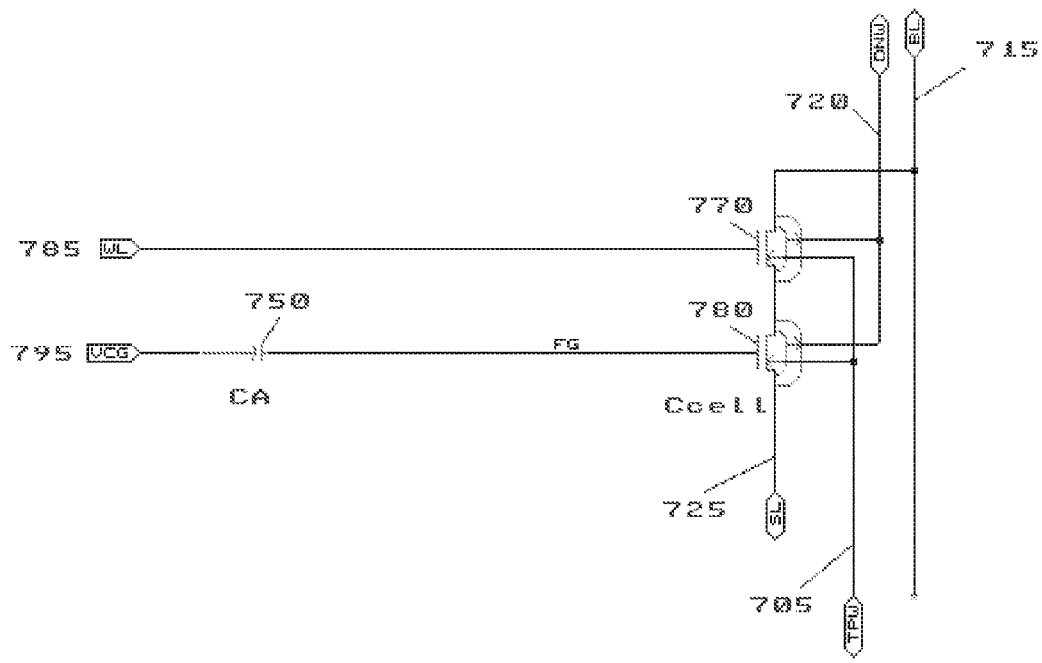
FIG. 6a is a schematic diagram of a floating gate HV NMOS transistor with one PIP or MIM capacitor according to the sixth embodiment of the present invention.
FIG. 6b is a table illustrating the voltage levels of voltage sources applied to the floating gate HV NMOS transistor with one PIP or MIM capacitor of the sixth embodiment.

FIG. 6a shows a schematic diagram of the sixth embodiment of the single-polycrystalline silicon electrically erasable programmable floating gate memory device of the present invention in which two HV transistors are single-poly NMOS transistors formed in a triple P-well (TPW) in a deep N-well (DNW). The memory cell comprises a one pass HV NMOS transistor 770 and a floating gate HV NMOS transistor 780 with one PIP or MIM capacitor 750. The floating gate HV NMOS 780 and one pass transistor HV NMOS 770 are formed on TPW 705 in DNW 720. Those two HV NMOS transistors 770 and 780 are connected in series. BL 715 is connected to the drain side of HV NMOS 770 and SL 725 is connected to the source side of HV NMOS 780. In this embodiment, VNN and VPP voltage levels are used to bias the source/drain side of the HV NMOS. However, the coupled high voltage will be established at the HV NMOS transistor 770 while performing erase and program operations.

According to the present invention, the single-polycrystalline floating gate HV NMOS storage transistor 780 of the sixth embodiment has a thick gate oxide with thickness approximately 400 Å, preferably in the range between 360 Å to 440 Å. The memory device requires only high voltages approximately +/−20V for both program and erase operations employing low-current Fowler Nordheim tunneling scheme. Preferably, the high voltage level is in the range between 18V to 22V.

With reference to the table in FIG. 6b, the program and erase operations for the storage HV NMOS transistor 780 refer to the Fowler-Nordheim tunneling program and erase operations occurring at the insulator oxide of HV NMOS transistor 780. During the program operation, VCG 795 is applied with VPP. However, WL 785 is applied with 0V and both SL 725 and BL 715 are applied with VNN. TPW 705 is applied with VNN and DNW 720 is applied with 0V. Because of the large coupling ratio, i.e., CA/(CA+Ccell)>90%, most of the positive voltage is coupled to the floating node FG, where Ccell is the effective capacitance of the HV NMOS transistor 780 and CA is the capacitance of the PIP or MIM capacitor 750. In the present invention, the ratio CA/Ccell is preferably greater than 10. Therefore, the smallest electric field (~1 MV/cm) occurs at the coupling capacitor 750 and a strong electric field (>10 MV/cm) occurs at the HV NMOS transistor 780. As a result, electrons are injected from the channel underneath HV NMOS transistor 780 into the charge storage floating gate FG through the insulator oxide and the threshold voltage of HV NMOS transistor 780 is increased. In the Fowler-Nordheim tunneling programming, it consumes only a current below 10 nA during program operation.

In a same manner, during the erase operation, VCG 795 is applied with VNN. WL 785, SL 725, BL 715, DNW 720 and TPW 705 are applied with VPP. Because of the large coupling ratio, i.e., CA/(CA+Ccell)>90%, most of the negative voltage is coupled to the floating node FG. With the bias voltages just described, the smallest electric field (~1 MV/cm) occurs at the coupling capacitor 750 and a strong electric field (>10 MV/cm) occurs at the HV NMOS transistor 780. As a result, electrons are extracted from the charge storage floating gate FG into the channel underneath the insulator oxide of HV NMOS transistor 780 and the threshold voltage of HV NMOS transistor 780 is decreased. In the Fowler-Nordheim tunneling erasing, it consumes only a current below 10 nA during erase operation.

In the program inhibition for the storage HV NMOS transistor 780, VCG 795 is still applied with VPP. However, WL 785, SL 725, DNW 720 and BL 715 are just applied with 0V. TPW 705 is applied with VNN. Thus, a certain portion, i.e., CA/(Ccell+CA), of VPP will be coupled to the FG node.

Therefore, the smallest electric field (~1 MV/cm) occurs at the coupling capacitor 750 and a smaller electric field (4~5 MV/cm) occurs at the HV NMOS transistor 780. With the biased conditions, the program inhibition prevents the threshold voltage of the HV NMOS transistor 780 form being changed.

For an unselected HV NMOS transistor 780 in a memory array during the program operation, there are two cases of program inhibition shown in the table of FIG. 6b. For the first case, SL 725 and BL 715 are still applied with VNN respectively. VCG 795 and DNW 720 are applied with 0V, and WL 785 and TPW 705 are applied with VNN. Thus, only a certain portion, i.e., Ccell/(Ccell+CA), of VNN will be coupled to the FG node. The smallest electric field (~1 MV/cm) occurs at the coupling capacitor 750 and the HV NMOS transistor 780. As a result, the program inhibition can prevent the threshold voltage of the HV NMOS transistor 780 from being changed.

In the second case, SL 725, DNW 720, BL 715 and VCG 795 are applied with 0V respectively. WL 785 and TPW 705 are applied with VNN. Therefore, no electric field occurs at the coupling PIP or MIM capacitor 750 and the HV NMOS transistor 780. As a result, the program inhibition can prevent the threshold voltage of the HV NMOS transistor 780 from being changed.

In a read operation, the selected VCG 795 and WL 785 are applied with VDD respectively. SL 725 and TPW 705 are applied with 0V and DNW 720 is applied with VDD. Thus, there is a read current flowing through the HV NMOS transistors 780 and 770 with 1V applied to BL 715 once the HV NMOS transistor 780 stays at the erase status.

With reference to the table in FIG. 7, a PIP or MIM capacitor of the present invention can be manufactured with three categories of technology. According to the necessary requirement in the electric field of the Fowler-Nordheim tunneling scheme, the oxide thickness and voltage range of VPP/VNN are shown respectively. For category 1, the thickness of the thick gate-oxide is about 400 Å+/−10%. The corresponding VPP is in the range from 18V to 22V and VNN is in the range between −18V and −22V. For category 2, the thickness of the thick gate-oxide is about 200 Å+/−10%. The corresponding VPP is in the range from 9V to 11V and VNN is in the range between −9V to −11V. For category 3, the thickness of the thick gate-oxide is about 100 Å+/−10%. The corresponding VPP is in the range from 4.5V to 5.5V and VNN is in the range between −4.5V and −5.5V.

In accordance with the present invention, the two capacitors made of either PIP or MIM are employed to eliminate the large well spacing required in the silicon layout of the memory device for effective cell size reduction and reducing of the required number of high voltages. In addition, with a thick floating-gate in the memory cell, superior data retention and least cell VT disturbance can be achieved in wide temperature and VDD operating ranges.

Although the present invention has been described with reference to the exemplary embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A single polycrystalline silicon electrically erasable and programmable floating gate memory device, comprising:
   a one-pass NMOS transistor having a drain connected to a bit line and a gate connected to a word line;
   a floating gate NMOS storage transistor having a single polycrystalline (single-poly) floating gate, a drain connected a source of said one-pass NMOS transistor and a source connected to a source line;
   a first polycrystalline-Insulator-polycrystalline (PIP) or metal-insulator-metal (MIM) capacitor, said first PIP or MIM capacitor having a first plate connected to said single-poly floating gate and a second plate connected to a first voltage source node; and
   a second PIP or MIM capacitor having a first plate connected to said single-poly floating gate and a second plate connected to a second voltage source node, said second PIP or MIM capacitor being a tunneling capacitor for said floating gate NMOS storage transistor;
   wherein said one-pass NMOS transistor and said floating gate NMOS storage transistor are formed in a triple P-well on a deep N-well, said first PIP or MIM capacitor is a coupling capacitor for coupling a substantial portion of a voltage level applied to said first voltage source node to said single-poly floating gate with a coupling ratio greater than 90%, said floating gate NMOS storage transistor has cell capacitance Ccell, said first PIP or MIM capacitor has capacitance CA which is greater than Ccell, and said second PIP or MIM capacitor has capacitance CB, and a ratio defined by (CA+Ccell)/CB is greater than 10.

2. The single polycrystalline silicon electrically erasable and programmable floating gate memory device as claimed in claim 1, wherein said one-pass NMOS transistor and said floating gate NMOS storage transistor are high voltage NMOS devices formed with a gate oxide having thickness in a range approximately from 360 Å to 440 Å.

3. The single polycrystalline silicon electrically erasable and programmable floating gate memory device as claimed in claim 2, further comprising a program operation when said memory device is a selected memory device for programming, wherein said program operation is accomplished by applying a positive voltage VPP to said bit line, said word line, said source line, said deep N-well, said triple P-well and said first voltage source node, and applying a negative voltage VNN to said second voltage source node, and wherein said VNN and said VPP have a same high voltage level approximately in a range from 18V to 22V but with opposite polarities.

4. The single polycrystalline silicon electrically erasable and programmable floating gate memory device as claimed in claim 3, further comprising an erase operation when said memory device is a selected memory device for erasing, wherein said erase operation is accomplished by applying said negative voltage VNN to said bit line, said source line, said triple P-well and said first voltage source node, applying said positive voltage VPP to said second voltage source node, and applying 0V to said word line and said deep N-well.

5. The single polycrystalline silicon electrically erasable and programmable floating gate memory device as claimed in claim 3, further comprising a program inhibition operation when said memory device is a selected memory device for program inhibition, wherein said program inhibition operation is accomplished by applying said positive voltage VPP to said bit line, said word line, said deep N-well, said source line, said triple P-well and said first voltage source node, and applying 0V to said second voltage source node.

6. The single polycrystalline silicon electrically erasable and programmable floating gate memory device as claimed in claim 3, further comprising a program inhibition operation when said memory device is an unselected memory device for program inhibition, wherein said program inhibition operation is accomplished by applying said positive voltage VPP to said bit line, said source line, said deep N-well and said triple P-well, applying 0V to said word line and said first voltage source node, and applying said negative voltage VNN to said second voltage source node.

7. The single polycrystalline silicon electrically erasable and programmable floating gate memory device as claimed in claim 3, further comprising a program inhibition operation when said memory device is an unselected memory device for program inhibition, wherein said program inhibition operation is accomplished by applying said positive voltage VPP to said bit line, said source line, said deep N-well and said triple P-well, and applying 0V to said word line, said first voltage source node and said second voltage source node.

8. The single polycrystalline silicon electrically erasable and programmable floating gate memory device as claimed in claim 2, further comprising a read operation when said memory device is a selected memory device for reading, wherein said read operation is accomplished by applying 0V to said source line, said triple P-well and said second voltage source node, applying 1V to said bit line, and applying a power supply voltage VDD to said word line, said first voltage source node and said deep N-well.

9. A single polycrystalline silicon electrically erasable and programmable floating gate memory device, comprising:
a one-pass NMOS transistor having a drain connected to a bit line and a gate connected to a word line;
a floating gate NMOS storage transistor having a single polycrystalline (single-poly) floating gate, a drain connected a source of said one-pass NMOS transistor and a source connected to a source line; and
a first polycrystalline-Insulator-polycrystalline (PIP) or metal-insulator-metal (MIM) capacitor, said first PIP or MIM capacitor having a first plate connected to said single-poly floating gate and a second plate connected to a first voltage source node;
wherein said one-pass NMOS transistor and said floating gate NMOS storage transistor are formed in a triple P-well on a deep N-well, said first PIP or MIM capacitor is a coupling capacitor for coupling a substantial portion of a voltage level applied to said first voltage source node to said single-poly floating gate with a coupling ratio greater than 90%, said floating gate NMOS storage transistor has cell capacitance Ccell, said first PIP or MIM capacitor has capacitance CA, and a ratio defined by CA/Ccell is greater than 10.

10. The single polycrystalline silicon electrically erasable and programmable floating gate memory device as claimed in claim 9, wherein said one-pass NMOS transistor and said floating gate NMOS storage transistor are high voltage NMOS devices formed with a gate oxide having thickness in a range approximately from 360 Å to 440 Å.

11. The single polycrystalline silicon electrically erasable and programmable floating gate memory device as claimed in claim 10, further comprising a program operation when said memory device is a selected memory device for programming, wherein said program operation is accomplished by applying a negative voltage VNN to said bit line, said source line and said triple P-well, applying a positive voltage VPP to said first voltage source node, and applying 0V to said word line and said deep N-well, and wherein said VNN and said VPP have a same high voltage level approximately in a range from 18V to 22V but with opposite polarities.

12. The single polycrystalline silicon electrically erasable and programmable floating gate memory device as claimed in claim 11, further comprising an erase operation when said memory device is a selected memory device for erasing, wherein said erase operation is accomplished by applying said positive voltage VPP to said bit line, said word line, said deep N-well, said source line and said triple P-well, and applying said negative voltage VNN to said first voltage source node.

13. The single polycrystalline silicon electrically erasable and programmable floating gate memory device as claimed in claim 11, further comprising a program inhibition operation when said memory device is a selected memory device for program inhibition, wherein said program inhibition operation is accomplished by applying 0V to said bit line, said word line, said source line and said deep N-well, applying said positive voltage VPP to said first voltage source node, and applying a negative voltage VNN to said triple P-well.

14. The single polycrystalline silicon electrically erasable and programmable floating gate memory device as claimed in claim 11, further comprising a program inhibition operation when said memory device is an unselected memory device for program inhibition, wherein said program inhibition operation is accomplished by applying said negative voltage VNN to said bit line, said word line, said source line and said triple P-well, and applying 0V to said first voltage source node and said deep N-well.

15. The single polycrystalline silicon electrically erasable and programmable floating gate memory device as claimed in claim 11, further comprising a program inhibition operation when said memory device is an unselected memory device for program inhibition, wherein said program inhibition operation is accomplished by applying 0V to said bit line, said first voltage source node, said deep N-well and said source line, and applying said negative voltage VNN to said word line and said triple P-well.

16. The single polycrystalline silicon electrically erasable and programmable floating gate memory device as claimed in claim 10, further comprising a read operation when said memory device is a selected memory device for reading, wherein said read operation is accomplished by applying 0V to said source line and said triple P-well, applying 1V to said bit line, and applying a power supply voltage VDD to said word line, said first voltage source node and said deep N-well.

17. A single polycrystalline silicon electrically erasable and programmable floating gate memory device, comprising:
a one-pass NMOS transistor having a drain connected to a bit line and a gate connected to a word line;
a floating gate NMOS storage transistor having a single polycrystalline (single-poly) floating gate, a drain connected a source of said one-pass NMOS transistor and a source connected to a source line;
a first polycrystalline-Insulator-polycrystalline (PIP) or metal-insulator-metal (MIM) capacitor, said first PIP or MIM capacitor having a first plate connected to said single-poly floating gate and a second plate connected to a first voltage source node; and
a second PIP or MIM capacitor having a first plate connected to said single-poly floating gate and a second plate connected to a second voltage source node, said second PIP or MIM capacitor being a tunneling capacitor for said floating gate NMOS storage transistor;
wherein said one-pass NMOS transistor and said floating gate NMOS storage transistor are formed on a P-substrate, said first PIP or MIM capacitor is a coupling capacitor for coupling a substantial portion of a voltage level applied to said voltage first source node to said single-poly floating gate with a coupling ratio greater than 90%, said floating gate NMOS storage transistor has cell capacitance Ccell, said first PIP or MIM capacitor has capacitance CA which is significantly greater than Ccell, and said second PIP or MIM capacitor has capacitance CB, and a ratio defined by (CA+Ccell)/CB is greater than 10.

18. The single polycrystalline silicon electrically erasable and programmable floating gate memory device as claimed in claim 17, wherein said one-pass NMOS transistor and said floating gate NMOS storage transistor are medium voltage NMOS devices formed with a gate oxide having thickness in a range approximately from 180 Å to 220 Å.

19. The single polycrystalline silicon electrically erasable and programmable floating gate memory device as claimed in claim 18, further comprising a program operation when said memory device is a selected memory device for programming, wherein said program operation is accomplished by applying a power supply voltage VDD to said bit line, said source line and said word line, applying a positive voltage VPP to said first voltage source node, and applying a negative voltage VNN to said second voltage source node, and wherein said VNN and said VPP have a same medium voltage level approximately in a range from 9V to 11V but with opposite polarities.

20. The single polycrystalline silicon electrically erasable and programmable floating gate memory device as claimed in claim 19, further comprising an erase operation when said memory device is a selected memory device for erasing, wherein said erase operation is accomplished by applying 0V to said bit line and said source line, applying said power supply voltage VDD to said word line, applying said negative voltage VNN to said first voltage source node, and applying said positive voltage VPP to said second voltage source node.

21. The single polycrystalline silicon electrically erasable and programmable floating gate memory device as claimed in claim 19, further comprising a program inhibition operation when said memory device is a selected memory device for program inhibition, wherein said program inhibition operation is accomplished by applying said power supply voltage VDD to said bit line, said source line and said word line, applying 0V to said second voltage source node, and applying said positive voltage VPP to said first voltage source node.

22. The single polycrystalline silicon electrically erasable and programmable floating gate memory device as claimed in claim 19, further comprising a program inhibition operation when said memory device is an unselected memory device for program inhibition, wherein said program inhibition operation is accomplished by applying said power supply voltage VDD to said bit line and said source line, applying 0V to said word line and said first voltage source node, and applying said negative voltage VNN to said second voltage source node.

23. The single polycrystalline silicon electrically erasable and programmable floating gate memory device as claimed in claim 19, further comprising a program inhibition operation when said memory device is an unselected memory device for program inhibition, wherein said program inhibition operation is accomplished by applying said power supply voltage VDD to said bit line and said source line, and applying 0V to said word line, said first voltage source node and said second voltage source node.

24. The single polycrystalline silicon electrically erasable and programmable floating gate memory device as claimed in claim 18, further comprising a program operation when said memory device is a selected memory device for programming, wherein said program operation is accomplished by applying 0V to said bit line and said source line, applying a power supply voltage VDD to said word line, applying a negative voltage VNN to said first voltage source node, and applying a positive voltage VPP to said second voltage source node, and wherein said VNN and said VPP have a same medium voltage level approximately in a range from 9V to 11V but with opposite polarities.

25. The single polycrystalline silicon electrically erasable and programmable floating gate memory device as claimed in claim 24, further comprising an erase operation when said memory device is a selected memory device for erasing, wherein said erase operation is accomplished by applying said power supply voltage VDD to said bit line, said source line and said word line, applying said negative voltage VNN to said second voltage source node, and applying said positive voltage VPP to said first voltage source node.

26. The single polycrystalline silicon electrically erasable and programmable floating gate memory device as claimed in claim 24, further comprising a program inhibition operation when said memory device is a selected memory device for program inhibition, wherein said program inhibition operation is accomplished by applying 0V to said bit line, said source line and said second voltage source node, applying said power supply voltage VDD to said word line, and applying said negative voltage VNN to said first voltage source node.

27. The single polycrystalline silicon electrically erasable and programmable floating gate memory device as claimed in claim 24, further comprising a program inhibition operation when said memory device is an unselected memory device for program inhibition, wherein said program inhibition operation is accomplished by applying 0V to said bit line, said source line, said word line and said first voltage source node, and applying said positive voltage VPP to said second voltage source node.

28. The single polycrystalline silicon electrically erasable and programmable floating gate memory device as claimed in claim 24, further comprising a program inhibition operation when said memory device is an unselected memory device for program inhibition, wherein said program inhibition operation is accomplished by applying 0V to said bit line, said source line, said word line, said first voltage source node and said second voltage source node.

29. The single polycrystalline silicon electrically erasable and programmable floating gate memory device as claimed in claim 18, further comprising a read operation when said memory device is a selected memory device for reading, wherein said read operation is accomplished by applying 0V to said source line and said second voltage source node, applying 1V to said bit line, and applying a power supply voltage VDD to said word line and said first voltage source node.

30. The single polycrystalline silicon electrically erasable and programmable floating gate memory device as claimed in claim 16, wherein said one-pass NMOS transistor and said floating gate NMOS storage transistor are medium voltage NMOS devices formed with a gate oxide having thickness in a range approximately from 90 Å to 110 Å.

31. The single polycrystalline silicon electrically erasable and programmable floating gate memory device as claimed in claim 30, further comprising a program operation when said memory device is a selected memory device for programming, wherein said program operation is accomplished by applying a power supply voltage VDD to said bit line, said source line and said word line, applying a positive voltage VPP to said first voltage source node, and applying a negative voltage VNN to said second voltage source node, and wherein said VNN and said VPP have a same medium voltage level approximately in a range from 4.5V to 5.5V but with opposite polarities.

32. The single polycrystalline silicon electrically erasable and programmable floating gate memory device as claimed in claim 31, further comprising an erase operation when said memory device is a selected memory device for erasing, wherein said erase operation is accomplished by applying 0V to said bit line and said source line, applying said power supply voltage VDD to said word line, applying said negative voltage VNN to said first voltage source node, and applying said positive voltage VPP to said second voltage source node.

33. The single polycrystalline silicon electrically erasable and programmable floating gate memory device as claimed in claim 31, further comprising a program inhibition operation when said memory device is a selected memory device for program inhibition, wherein said program inhibition operation is accomplished by applying said power supply voltage VDD to said bit line, said source line and said word line, applying 0V to said second voltage source node, and applying said positive voltage VPP to said first voltage source node.

34. The single polycrystalline silicon electrically erasable and programmable floating gate memory device as claimed in claim 31, further comprising a program inhibition operation when said memory device is an unselected memory device for program inhibition, wherein said program inhibition operation is accomplished by applying said power supply voltage VDD to said bit line and said source line, applying 0V to said word line and said first voltage source node, and applying said negative voltage VNN to said second voltage source node.

35. The single polycrystalline silicon electrically erasable and programmable floating gate memory device as claimed in claim 31, further comprising a program inhibition operation when said memory device is an unselected memory device for program inhibition, wherein said program inhibition operation is accomplished by applying said power supply voltage VDD to said bit line and said source line, and applying 0V to said word line, said first voltage source node and said second voltage source node.

36. The single polycrystalline silicon electrically erasable and programmable floating gate memory device as claimed in claim 30, further comprising a program operation when said memory device is a selected memory device for programming, wherein said program operation is accomplished by applying 0V to said bit line and said source line, applying a power supply voltage VDD to said word line, applying a negative voltage VNN to said first voltage source node, and applying a positive voltage VPP to said second voltage source node, and wherein said VNN and said VPP have a same medium voltage level approximately in a range from 4.5V to 5.5V but with opposite polarities.

37. The single polycrystalline silicon electrically erasable and programmable floating gate memory device as claimed in claim 36, further comprising an erase operation when said memory device is a selected memory device for erasing, wherein said erase operation is accomplished by applying said power supply voltage VDD to said bit line, said source line and said word line, applying said negative voltage VNN to said second voltage source node, and applying said positive voltage VPP to said first voltage source node.

38. The single polycrystalline silicon electrically erasable and programmable floating gate memory device as claimed in claim 36, further comprising a program inhibition operation when said memory device is a selected memory device for program inhibition, wherein said program inhibition operation is accomplished by applying 0V to said bit line, said source line and said second voltage source node, applying said power supply voltage VDD to said word line, and applying said negative voltage VNN to said first voltage source node.

39. The single polycrystalline silicon electrically erasable and programmable floating gate memory device as claimed in claim 36, further comprising a program inhibition operation when said memory device is an unselected memory device for program inhibition, wherein said program inhibition operation is accomplished by applying 0V to said bit line, said source line, said word line and said first voltage source node, and applying said positive voltage VPP to said second voltage source node.

40. The single polycrystalline silicon electrically erasable and programmable floating gate memory device as claimed in claim 36, further comprising a program inhibition operation when said memory device is an unselected memory device for program inhibition, wherein said program inhibition operation is accomplished by applying 0V to said bit line, said source line, said word line, said first voltage source node and said second voltage source node.

41. The single polycrystalline silicon electrically erasable and programmable floating gate memory device as claimed in claim 30, further comprising a read operation when said memory device is a selected memory device for reading, wherein said read operation is accomplished by applying 0V to said source line and said second voltage source node, applying 1V to said bit line, and applying a power supply voltage VDD to said word line and said first voltage source node.

\* \* \* \* \*